(12) United States Patent
Tang et al.

(10) Patent No.: US 8,264,010 B2
(45) Date of Patent: Sep. 11, 2012

(54) LAYOUT FOR HIGH DENSITY CONDUCTIVE INTERCONNECTS

(75) Inventors: Qiang Tang, Stanford, CA (US); Ramin Ghodsi, Cupertino, CA (US)

(73) Assignee: Round Rock Research, LLC, Mt. Kisco, NY (US)

( * ) Notice: Subject to any disclaimer, the term of this patent is extended or adjusted under 35 U.S.C. 154(b) by 64 days.

(21) Appl. No.: 12/830,754

(22) Filed: Jul. 6, 2010

(65) Prior Publication Data

US 2011/0006347 A1 Jan. 13, 2011

Related U.S. Application Data

(63) Continuation of application No. 12/185,633, filed on Aug. 4, 2008, now Pat. No. 7,767,573, which is a continuation of application No. 11/192,828, filed on Jul. 29, 2005, now Pat. No. 7,413,981.

(51) Int. Cl.
  *H01L 27/118* (2006.01)
(52) U.S. Cl. .................. 257/206; 257/211; 257/E27.026
(58) Field of Classification Search ................... 365/104; 257/206, E21.582, E21.595, E27.026, 211; 326/38, 41; 438/599, 129, 947
See application file for complete search history.

(56) References Cited

U.S. PATENT DOCUMENTS

| | | | |
|---|---|---|---|
| 4,234,362 A | 11/1980 | Riseman | |
| 4,419,809 A | 12/1983 | Riseman et al. | |
| 4,432,132 A | 2/1984 | Kinsbron et al. | |
| 4,502,914 A | 3/1985 | Trumpp et al. | |
| 4,508,579 A | 4/1985 | Goth et al. | |
| 4,570,325 A | 2/1986 | Higuchi | |
| 4,648,937 A | 3/1987 | Ogura et al. | |
| 4,716,131 A | 12/1987 | Okazawa et al. | |
| 4,776,922 A | 10/1988 | Bhattacharyya et al. | |

(Continued)

FOREIGN PATENT DOCUMENTS

DE 280851 C 7/1990

(Continued)

OTHER PUBLICATIONS

"Ex parte Cantell, unpublished decision of the Board of Patent Appeals and Interferences, Mar. 4, 2005".

(Continued)

*Primary Examiner* — Caridad Everhart
(74) *Attorney, Agent, or Firm* — Lerner, David, Littenberg & Krumholz & Mentlik, LLP (57) ABSTRACT

In one embodiment of the present invention, a method for connecting a plurality of bit lines to sense circuitry comprises providing a plurality of bit lines extending from a memory array in a first metal layer. The plurality of bit lines are separated from each other by an average spacing x in a first region of the first metal layer. The method further comprises elevating a portion of the plurality of bit lines into a second metal layer overlying the first metal layer. The elevated bit lines are separated from each other by an average spacing y in the second metal layer, with y>x. The method further comprises extending a portion of the plurality of bit lines into a second region of the first metal layer. The extended bit lines are separated from each other by an average spacing z in the second region of the first metal layer, with z>x. The method further comprises connecting a bit line in the second metal layer and a bit line in the first metal layer to the sense circuitry.

9 Claims, 6 Drawing Sheets

U.S. PATENT DOCUMENTS

| | | | |
|---|---|---|---|
| 4,838,991 A | 6/1989 | Cote et al. | |
| 5,013,680 A | 5/1991 | Lowrey et al. | |
| 5,047,117 A | 9/1991 | Roberts | |
| 5,053,105 A | 10/1991 | Fox, III | |
| 5,117,027 A | 5/1992 | Bernhardt et al. | |
| 5,328,810 A | 7/1994 | Lowrey et al. | |
| 5,330,879 A | 7/1994 | Dennison | |
| 5,514,885 A | 5/1996 | Myrick | |
| 5,670,794 A | 9/1997 | Manning | |
| 5,753,546 A | 5/1998 | Koh et al. | |
| 5,795,830 A | 8/1998 | Cronin et al. | |
| 5,998,256 A | 12/1999 | Juengling | |
| 6,004,862 A | 12/1999 | Kim et al. | |
| 6,010,946 A | 1/2000 | Hisamune et al. | |
| 6,042,998 A | 3/2000 | Brueck et al. | |
| 6,057,573 A | 5/2000 | Kirsch et al. | |
| 6,063,688 A | 5/2000 | Doyle et al. | |
| 6,071,789 A | 6/2000 | Yang et al. | |
| 6,211,044 B1 | 4/2001 | Xiang et al. | |
| 6,282,113 B1 | 8/2001 | DeBrosse | |
| 6,288,454 B1 | 9/2001 | Allman et al. | |
| 6,291,334 B1 | 9/2001 | Somekh | |
| 6,297,554 B1 | 10/2001 | Lin | |
| 6,348,380 B1 | 2/2002 | Weimer et al. | |
| 6,362,057 B1 | 3/2002 | Taylor, Jr. et al. | |
| 6,383,907 B1 | 5/2002 | Hasegawa et al. | |
| 6,395,613 B1 | 5/2002 | Juengling | |
| 6,404,056 B1 | 6/2002 | Kuge et al. | |
| 6,423,474 B1 | 7/2002 | Holscher | |
| 6,455,372 B1 | 9/2002 | Weimer | |
| 6,475,867 B1 | 11/2002 | Hui et al. | |
| 6,514,884 B2 | 2/2003 | Maeda | |
| 6,522,584 B1 | 2/2003 | Chen et al. | |
| 6,534,243 B1 | 3/2003 | Templeton et al. | |
| 6,548,396 B2 | 4/2003 | Naik et al. | |
| 6,566,280 B1 | 5/2003 | Meagley et al. | |
| 6,573,030 B1 | 6/2003 | Fairbairn et al. | |
| 6,602,779 B1 | 8/2003 | Li et al. | |
| 6,632,741 B1 | 10/2003 | Clevenger et al. | |
| 6,667,237 B1 | 12/2003 | Metzler | |
| 6,673,684 B1 | 1/2004 | Huang et al. | |
| 6,686,245 B1 | 2/2004 | Mathew et al. | |
| 6,689,695 B1 | 2/2004 | Lui et al. | |
| 6,706,571 B1 | 3/2004 | Yu et al. | |
| 6,709,807 B2 | 3/2004 | Hallock et al. | |
| 6,734,107 B2 | 5/2004 | Lai et al. | |
| 6,744,094 B2 | 6/2004 | Forbes | |
| 6,768,663 B2 | 7/2004 | Ogata | |
| 6,773,998 B1 | 8/2004 | Fisher et al. | |
| 6,777,725 B2 | 8/2004 | Willer et al. | |
| 6,794,699 B2 | 9/2004 | Bissey et al. | |
| 6,800,930 B2 | 10/2004 | Jackson et al. | |
| 6,867,116 B1 | 3/2005 | Chung | |
| 6,875,703 B1 | 4/2005 | Furukawa et al. | |
| 6,893,972 B2 | 5/2005 | Rottstegge et al. | |
| 6,962,867 B2 | 11/2005 | Jackson et al. | |
| 2001/0005631 A1 | 6/2001 | Kim et al. | |
| 2002/0042198 A1 | 4/2002 | Bjarnason et al. | |
| 2002/0045308 A1 | 4/2002 | Juengling | |
| 2002/0063110 A1 | 5/2002 | Cantell et al. | |
| 2002/0125538 A1* | 9/2002 | Abedifard et al. | 257/390 |
| 2002/0127810 A1 | 9/2002 | Nakamura | |
| 2002/0130348 A1 | 9/2002 | Tran | |
| 2002/0158273 A1 | 10/2002 | Satoh et al. | |
| 2003/0006410 A1 | 1/2003 | Doyle | |
| 2003/0044722 A1 | 3/2003 | Hsu et al. | |
| 2003/0119307 A1 | 6/2003 | Bekiaris et al. | |
| 2003/0127426 A1 | 7/2003 | Chang et al. | |
| 2003/0157436 A1 | 8/2003 | Manger et al. | |
| 2003/0207207 A1 | 11/2003 | Li | |
| 2003/0207584 A1 | 11/2003 | Sivakumar et al. | |
| 2003/0230234 A1 | 12/2003 | Nam et al. | |
| 2004/0000534 A1 | 1/2004 | Lipinski | |
| 2004/0018738 A1 | 1/2004 | Liu | |
| 2004/0023475 A1 | 2/2004 | Bonser et al. | |
| 2004/0023502 A1 | 2/2004 | Tzou et al. | |
| 2004/0041189 A1 | 3/2004 | Voshell et al. | |
| 2004/0043623 A1 | 3/2004 | Liu et al. | |
| 2004/0053475 A1 | 3/2004 | Sharma | |
| 2004/0079988 A1 | 4/2004 | Harari | |
| 2004/0085804 A1* | 5/2004 | Winograd et al. | 365/145 |
| 2004/0106257 A1 | 6/2004 | Okamura et al. | |
| 2004/0165441 A1* | 8/2004 | Chevallier | 365/185.11 |
| 2004/0235255 A1 | 11/2004 | Tanaka et al. | |
| 2005/0045918 A1* | 3/2005 | Reith | 257/208 |
| 2005/0074949 A1 | 4/2005 | Jung et al. | |
| 2005/0164454 A1 | 7/2005 | Leslie | |
| 2005/0186705 A1 | 8/2005 | Jackson et al. | |
| 2005/0272259 A1 | 12/2005 | Hong | |
| 2006/0028859 A1 | 2/2006 | Forbes | |
| 2006/0046200 A1 | 3/2006 | Abatchev et al. | |
| 2006/0046201 A1 | 3/2006 | Sandhu et al. | |
| 2006/0046422 A1 | 3/2006 | Tran et al. | |
| 2006/0046484 A1 | 3/2006 | Abatchev et al. | |
| 2006/0083996 A1 | 4/2006 | Kim | |
| 2006/0172540 A1 | 8/2006 | Marks et al. | |
| 2006/0211260 A1 | 9/2006 | Tran et al. | |
| 2006/0216923 A1 | 9/2006 | Tran et al. | |
| 2006/0231900 A1 | 10/2006 | Lee et al. | |
| 2006/0263699 A1 | 11/2006 | Abatchev et al. | |
| 2006/0267075 A1 | 11/2006 | Sandhu et al. | |
| 2006/0273456 A1 | 12/2006 | Sant et al. | |
| 2006/0278911 A1 | 12/2006 | Eppich | |
| 2006/0281266 A1 | 12/2006 | Wells | |
| 2007/0026672 A1 | 2/2007 | Tang et al. | |
| 2007/0045712 A1 | 3/2007 | Haller et al. | |
| 2007/0048674 A1 | 3/2007 | Wells | |
| 2007/0049011 A1 | 3/2007 | Tran | |
| 2007/0049030 A1 | 3/2007 | Sandhu et al. | |
| 2007/0049032 A1 | 3/2007 | Abatchev et al. | |
| 2007/0049035 A1 | 3/2007 | Tran | |
| 2007/0049040 A1 | 3/2007 | Bai et al. | |
| 2007/0050748 A1 | 3/2007 | Juengling | |
| 2007/0145450 A1 | 6/2007 | Wang et al. | |

FOREIGN PATENT DOCUMENTS

| | | | |
|---|---|---|---|
| DE | 4236609 A1 | 5/1994 | |
| EP | 0227303 A2 | 7/1987 | |
| EP | 0491408 A2 | 6/1992 | |
| EP | 1357433 A2 | 10/2003 | |
| JP | 5343370 A | 12/1993 | |
| JP | H855908 | 2/1996 | |
| JP | H855920 | 2/1996 | |
| WO | 02099864 A1 | 12/2002 | |
| WO | 2004001799 A2 | 12/2003 | |
| WO | 2004003977 A2 | 1/2004 | |
| WO | 2005010973 A1 | 2/2005 | |
| WO | 2005034215 A1 | 4/2005 | |
| WO | PCTUS2005029984 | 8/2005 | |
| WO | 2006026699 A2 | 3/2006 | |

OTHER PUBLICATIONS

"U.S. Appl. No. 11/543,515, filed Oct. 24, 2006".

B. Lim, Nature vol. 2, (Nov. 2003) pp. 749-753.

Bergeron, et al., "Resolution Enhancement Techniques for the 90nm Technology Node and Beyond," Future Fab International, Issue 15, Jul. 11, 2003, 4 pages.

Bhave et al., "Developer-soluble Gap fill materials for patterning metal trenches in Via-first Dual Damascene process," preprint of Proceedings of SPIE: Advances in Resist Technology and Processing XXI, vol. 5376, John L. Sturtevant, editor, 2004, 8pages.

Choi et al., "Sublithographic nanofabrication technology for nanocatalysts and DNA chips," J.Vac. Sci. Technol., Nov./Dec. 2003; pp. 2951-2955.

Chung et al., "Nanoscale Multi-Line Patterning Using Sidewall Structure," Jpn., J. App.. Phys. vol. 41 (2002) Pt. 1, No. 6B, pp. 4410-4414.

Chung et al., "Pattern multiplication method and the uniformity of nanoscale multiple lines," J.Vac.Sci.Technol. B21(4), Jul./Aug. 2003, pp. 1491-1495.

Joubert et al., "Nanometer scale linewidth control during etching of polysilicon gates in high-density plasmas," Microelectronic Engineering 69 (2003), pp. 350-357.

Oehrlein et al., "Pattern transfer into low dielectic materials by high-density plasma etching," Solid State Tech., May 2000, 8 pages.
U.S. Appl. No. 10/931,771, filed Aug. 31, 2004.
U.S. Appl. No. 10/932,993, filed Sep. 1, 2004.
U.S. Appl. No. 10/934,317, filed Sep. 2, 2004.
U.S. Appl. No. 10/934,778, filed Sep. 2, 2004.
U.S. Appl. No. 11/214,544, filed Aug. 29, 2005.

* cited by examiner

LAYOUT FOR HIGH DENSITY CONDUCTIVE INTERCONNECTS

CROSS-REFERENCE TO RELATED APPLICATIONS

This patent application is a continuation of U.S. patent application Ser. No. 12/185,633, filed Aug. 4, 2008, now U.S. Pat. No. 7,767,573, which application is a continuation of U.S. patent application Ser. No. 11/192,828, filed Jul. 29, 2005, now U.S. Pat. No. 7,413,981, which application is related to U.S. patent application Ser. No. 10/931,771, filed Aug. 31, 2004, now U.S. Pat. No. 7,151,040, the entire contents of which are hereby incorporated by reference herein.

FIELD OF THE INVENTION

This invention relates generally to integrated circuit fabrication, and more specifically to integrated circuit layout patterns and techniques.

BACKGROUND OF THE INVENTION

Integrated circuits are continually being made smaller as demand for portability, computing power, memory capacity and energy efficiency in modern electronics grows. Therefore, the size of the integrated circuit constituent features, such as electrical devices and interconnect line widths, is also decreasing continually. The trend of decreasing feature size is evident in memory circuits and memory devices such as dynamic random access memory ("DRAM"), static random access memory ("SRAM"), ferroelectric ("FEW") memory, electrically erasable programmable read only memory ("EEPROM"), and so forth.

For example, flash memory is a type of EEPROM that typically comprises millions of individual circuit elements, known as memory cells, arranged into a densely-packed array. A flash memory cell typically comprises a transistor, a floating gate, and a control gate stacked above the floating gate. The floating gate, typically composed of polycrystalline silicon, is electrically isolated from the underlying semiconductor substrate by a thin dielectric layer which is typically formed of an insulating oxide such as silicon oxide. Because charge is transferred across the dielectric layer by quantum mechanical tunneling, this dielectric layer is often referred to as a "tunnel oxide" layer. Such tunnel oxide layers are typically approximately 100 Å thick. Properties of the tunnel oxide are controlled to enable the ability to read and write by tunneling, while avoiding data loss through charge trapping or leakage. The control gate is positioned above the floating gate, and is electrically isolated from the floating gate by a storage dielectric layer, such as oxide-nitride-oxide ("ONO"). Electrical access to the floating gate is therefore through capacitors. By decreasing the size of the transistor devices that form the individual memory cells, the size of a flash memory array can likewise be decreased. Thus, storage capacities can be increased by fitting more memory cells into a given circuit volume. Generally, flash memory arrays have a higher density of memory cells than DRAM arrays.

The distance between an identical point on two features in neighboring integrated circuit patterns, such as two features in a pattern of word lines or bit lines, is commonly referred to the "pitch" of the pattern. Integrated circuit features are typically defined by openings in, and are spaced apart from each other by, a material such as an insulator or a conductor. Thus, the concept of pitch can be understood as the sum of the width of a feature and the width of the space separating that feature from a neighboring feature.

BRIEF SUMMARY OF THE INVENTION

In one embodiment of the present invention, a method for connecting a plurality of bit lines to sense circuitry comprises providing a plurality of bit lines extending from a memory array in a first metal layer. The plurality of bit lines are separated from each other by an average spacing x in a first region of the first metal layer. The method further comprises elevating a portion of the plurality of bit lines into a second metal layer overlying the first metal layer. The elevated bit lines are separated from each other by an average spacing y in the second metal layer, with y>x. The method further comprises extending a portion of the plurality of bit lines into a second region of the first metal layer. The extended bit lines are separated from each other by an average spacing z in the second region of the first metal layer, with z>x. The method further comprises connecting a bit line in the second metal layer and a bit line in the first metal layer to the sense circuitry.

In another embodiment of the present invention, a method comprises providing an array of conductive lines extending from a memory device. The method further comprises, in an interface region, separating the array into two vertically separated metal layers. A first portion of the conductive lines are positioned in a lower metal layer, and a second portion of the conductive lines are positioned in an upper metal layer. The method further comprises connecting the first and second portions of conductive lines to sense circuitry. The interface region is positioned between the sense circuitry and the array.

In another embodiment of the present invention, a method of forming an integrated circuit comprises patterning a first array of conductive lines in a first metal layer. A first portion of the conductive lines are present in a first region of the first metal layer. A second portion of the conductive lines are present in the first region of the first metal layer and in a second region of the first metal layer. The conductive lines have an average line spacing of x in the first region, and the conductive lines have an average line spacing of y in the second region, with y>x. The method further comprises forming a contact over the first metal layer. The contact touches one of the conductive lines in the first portion of conductive lines. The method further comprises patterning a second array of conductive lines in a second metal layer that is vertically separated from the first metal layer. The second array has an average line spacing of z, wherein z>x. At least one of the second portion of conductive lines touches the contact. The method further comprises connecting a conductive line from the second array and a conductive line from the second region of the first array to sense circuitry.

In another embodiment of the present invention, an integrated circuit comprises a first array of conductive lines extending from a memory array in a first dimension. The conductive lines in the first array are separated from each other by an average spacing x in a second dimension that is orthogonal to the first dimension. The integrated circuit further comprises a plurality of contacts that provide electrical connection from a first group of conductive lines in the first array to a second array of conductive lines. The second array is separated from the first array in a third dimension that is orthogonal to the first and second dimensions. The conductive lines in the second array are separated from each other by an average spacing y in the second dimension, wherein y>x. The integrated circuit further comprises a third array of conductive lines that are electrically connected to a second group of conductive lines in the first array. The third array is separated from the second array in the third dimension. The conductive lines in the third array are separated from each other by an average spacing z in the second dimension, wherein z>x. The integrated circuit further comprises sense circuitry. At least a portion of the conductive lines in the second array and at least a portion of the conductive lines in the third array are electrically connected to the sense circuitry.

In another embodiment of the present invention, a system comprises a memory device. The system further comprises a first array of conductive lines coupled to the memory device. The first array is positioned in a first region of a first metal layer. The conductive lines in the first array are spaced apart from each other in a first dimension by an average spacing x. The system further comprises a second array of conductive lines positioned in a second metal layer that is separated from the first metal layer in a second dimension. The second dimension is orthogonal to the first dimension. The conductive lines in the second array are spaced apart from each other in the first dimension by an average spacing y, with y>x. The conductive lines in the second array are electrically connected to a portion of the conductive lines in the first array. The system further comprises a third array of conductive lines positioned in a second region of the first metal layer. The conductive lines in the third array are spaced apart from each other in the first dimension by an average spacing z, with z>x. The conductive lines in the third array are electrically connected to a portion of the conductive lines in the first array. The system further comprises sense circuitry having a plurality of contacts. A first group of the contacts are electrically connected to the conductive lines in the third array. A second group of the contacts are electrically connected to conductive lines in the second array.

In another embodiment of the present invention, a memory device comprises an array of bit lines extending from a memory array in a first metal layer. The bit lines are spaced apart from each other by an average spacing x in a first region of the first metal layer. A first portion of the bit lines are shunted from the first region of the first metal layer to a second metal layer. The bit lines in the second metal layer are spaced apart from each other by an average spacing y, with y>x. A second portion of the bit lines are extended from the first region of the first metal layer to a second region of the first metal layer. The second region of the first metal layer is vertically spaced apart from the second metal layer. The bit lines in the second region of the first metal layer are spaced apart from each other by an average spacing z, where z>x. The memory device further comprises sense circuitry having a plurality of contacts. A first portion of the contacts are electrically connected to bit lines in the first metal layer. A second portion of the contacts are electrically connected to bit lines in the second metal layer.

In another embodiment of the present invention, a computer comprises a memory device. The computer further comprises a first array of n+m bit lines formed in a first metal layer. The n+m bit lines in the first array are spaced apart from each other by a first spacing interval. The computer further comprises a second array of m bit lines formed in a second metal layer overlying the first metal layer. The m bit lines in the second array are spaced apart from each other by a second spacing interval. The computer further comprises a third array of n bit lines formed in the first metal layer. The n bit lines in the third array are spaced apart from each other by a third spacing interval. The first array is positioned between the memory device and the third array. The first spacing interval is smaller than the second and third spacing intervals. Each of the n+m bit lines in the first array is connected to one of the n bit lines in the third array or one of the m bit lines in the second array. The computer further comprises sense circuitry having a plurality of contacts. A first contact is electrically connected to one of the n bit lines in the third array. A second contact is electrically connected to one of the m bit lines in the second array.

In another embodiment of the present invention, a method of using a memory device comprises providing a memory array in an integrated circuit. The memory array has a plurality of bit lines extending therefrom. The plurality of bit lines are spaced apart from each other by a spacing x in a region proximal to the memory array. The method further comprises providing a first electrical signal on a first bit line extending from the memory array. The first electrical signal is routed at least partially on a first metal level of the integrated circuit to a multiplexer. A distal region of the first bit line is separated from an adjacent bit line by a spacing z, with z>x. The method further comprises providing a second electrical signal on a second bit line extending from the memory array. The second electrical signal is routed at least partially on a second metal level of the integrated circuit to the multiplexer. The second metal level is vertically separated from the first metal level. A distal region of the second bit line is separated from an adjacent bit line by a spacing y, with y>x. The method further comprises amplifying the first and second electrical signals using a sense amplifier that is coupled to the multiplexer.

BRIEF DESCRIPTION OF THE DRAWINGS

Exemplary embodiments of the circuit layouts disclosed herein are illustrated in the accompanying drawings, which are for illustrative purposes only. The drawings comprise the following figures, in which like numerals indicate like parts.

DETAILED DESCRIPTION

As feature sizes decrease, ever greater demands are placed on the techniques used to form the features and to layout the features into a functional integrated circuit design. For example, photolithography is commonly used to pattern features, such as bit lines or word lines, in an integrated circuit. However, due to optical factors such as radiation wavelength, photolithography techniques have a minimum pitch below which features cannot be formed reliably. Thus, the minimum pitch of a photolithographic technique will limit the size of the features formed using that technique.

Pitch doubling is one method used to extend the capabilities of photolithographic techniques beyond their minimum pitch. A pitch doubling technique is described in U.S. Pat. No. 5,328,810 (issued 12 Jul. 1994), the entire disclosure of which is hereby incorporated by reference herein. While pitch doubling addresses the challenge of patterning features with a pitch below that possible using only photolithographic techniques, the challenge of providing a functional layout of pitch doubled features remains.

For example, a typical segment of NAND flash memory array includes several 64 bit line segments that extend from the array periphery. In one configuration, the pitch of this digit or bit line array is 2F, where F is the minimum feature size that a given photolithographic technique is capable of resolving. In an embodiment where a pitch "doubling" technique is used to decrease the width of the bit lines and the spacers separating the bit lines, the density of the bit line array is further increased, such that the pitch of the bit line array is reduced to F. For example, in an embodiment wherein 50 nm bit lines are separated by 50 nm spacers, the pitch of the bit line array extending from the memory cell is 100 nm. Using advanced photolithographic techniques, the width of the bit lines and spacers can be further decreased, for example to 35 nm or less. The circuit layout designs and techniques disclosed herein are usable with patterning techniques capable of forming even smaller bit lines and spacers. In an exemplary embodiment, the spacers used to separate the bit lines are regions of oxide material, such as silicon oxide.

In certain embodiments, the memory array is configured such that all 64 bit lines extend from one side of the array such that the array sense circuitry, used to measure signals provided on the bit lines, is positioned on one side of the array, rather than surrounding the array. Such positioning of the sense circuitry further facilitates reducing the size of the integrated circuit by conserving signal routing space. Positioning the sense circuitry on one side of the array also simplifies the circuit layouts used to connect the sense circuitry to other electrical components and enables faster timing to be achieved.

Figure 1:
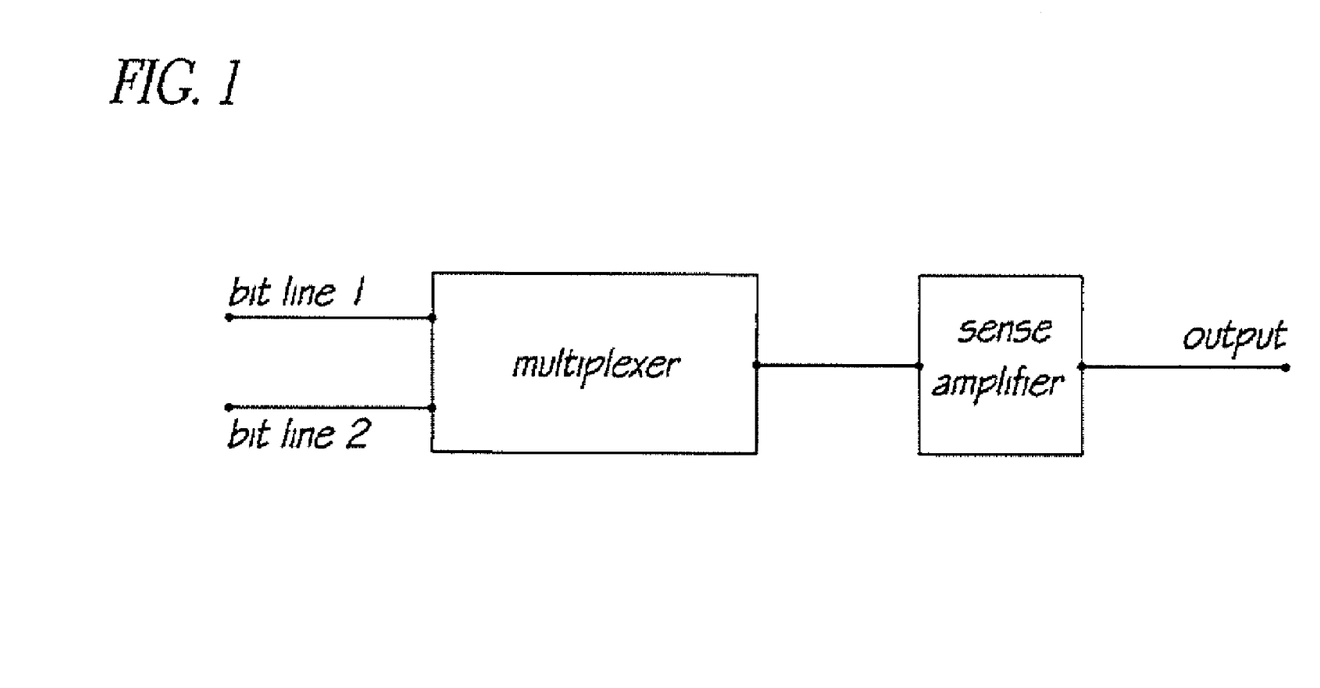
FIG. 1 is a schematic illustration for providing a multiplexed connection between memory array bit lines and a sense amplifier.

Sense circuitry is used to detect current, voltages and/or other electrical properties on the bit lines extending from the memory array. For example, a series of latches is often used to sense voltage on the bit lines, and to amplify the sensed voltage. Other sense circuitry is preferably also employed. Typically, a pair of bit lines are provided to a multiplexer, the output of which is provided to a single sense amplifier. This configuration, schematically illustrated in FIG. 1, allows a single sense amplifier to be used to measure signals on two different bit lines.

While configuring densely packed bit lines to extend from one side of the memory array provides certain advantages as expounded herein, it has, to this point, also provided challenges with respect to connecting the densely packed bit lines to the sense circuitry. For example, in a typical flash memory array having 64 bit lines extending from the array, it has previously been difficult or impossible to reliably connect bit lines having a width less than about 150 nm, and especially bit lines having a width less than about 100 nm, to the sense circuitry. Therefore, Applicants have developed improved circuit layout designs and methods for connecting densely packed bit lines from a memory array to sense circuitry.

To facilitate the connection of an array of densely packed bit lines to sense circuitry at the periphery of a memory array, the bit lines are separated into two vertically separated levels. In one embodiment, this separating of the bit lines is accomplished in a first interface region that is located between the memory array and the sense circuitry. In the first interface region, a portion of the bit lines are elevated to a second metal level that is vertically separated from the bit lines that remain in the first metal level. The first interface region optionally includes multiple stages or "transition regions" where multiple bit lines are elevated to the second metal level in groups. In a second interface region located between the first interface region and the sense circuitry, the remaining bit lines in the first metal level are "spread out" to occupy the space created by elevating bit lines to the second metal level in the first interface region. Preferably this scheme is employed to maintain connections from one series of parallel lines (memory array bit lines in the illustrated embodiment) to one type of circuitry (sense circuitry in the illustrated embodiment) on one side of the array. However, an ordinarily-skilled artisan will appreciate application of the principles and advantages disclosed herein to other arrays and to other connecting circuitry.

Figure 2:
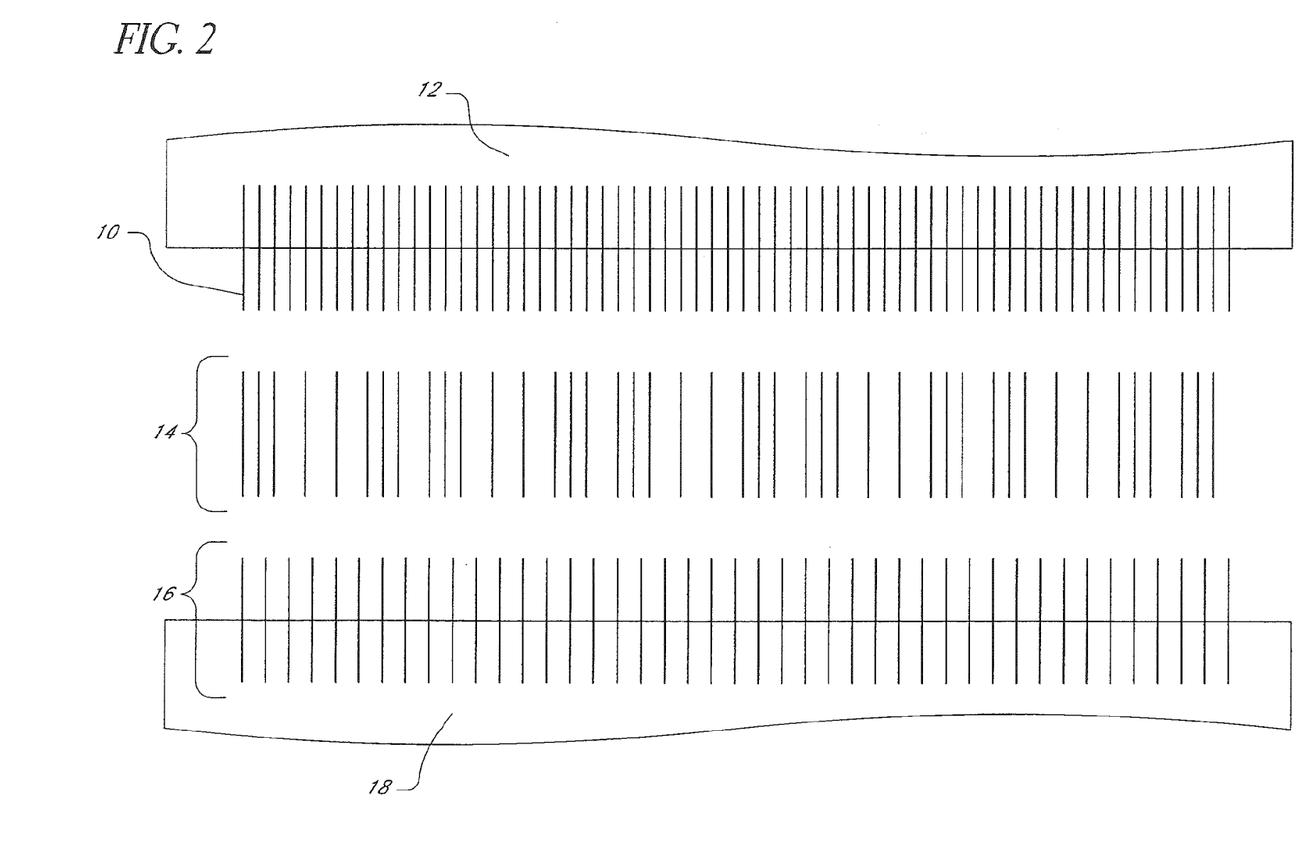
FIG. 2 is a schematic illustration of an exemplary circuit layout for spreading out a plurality of bit lines between a memory array and sense circuitry.

This arrangement is schematically illustrated in FIG. 2, which illustrates a plurality of bit lines 10 extending from a memory array 12. A plurality of the bit lines are elevated to a second metal layer in a first interface region 14. The second metal layer is not shown in FIG. 2 for clarity. By elevating a portion of the bit lines 10 to the second metal layer, fewer bit lines remain in the first metal layer as compared to the total number of bit lines extending from the memory array 12. In certain embodiments, the first interface region optionally includes multiple stages where bit lines are elevated, or "converted", to the second metal layer. FIG. 2 schematically illustrates one of these stages.

Once a portion of the bit lines are elevated to the second metal layer, the bit lines remaining in the first metal layer are spaced apart from each other in a second interface region 16. The spaced apart bit lines are then connected to sense circuitry 18, which can also be configured to receive contacts from the bit lines present in the second metal layer.

Figure 3:
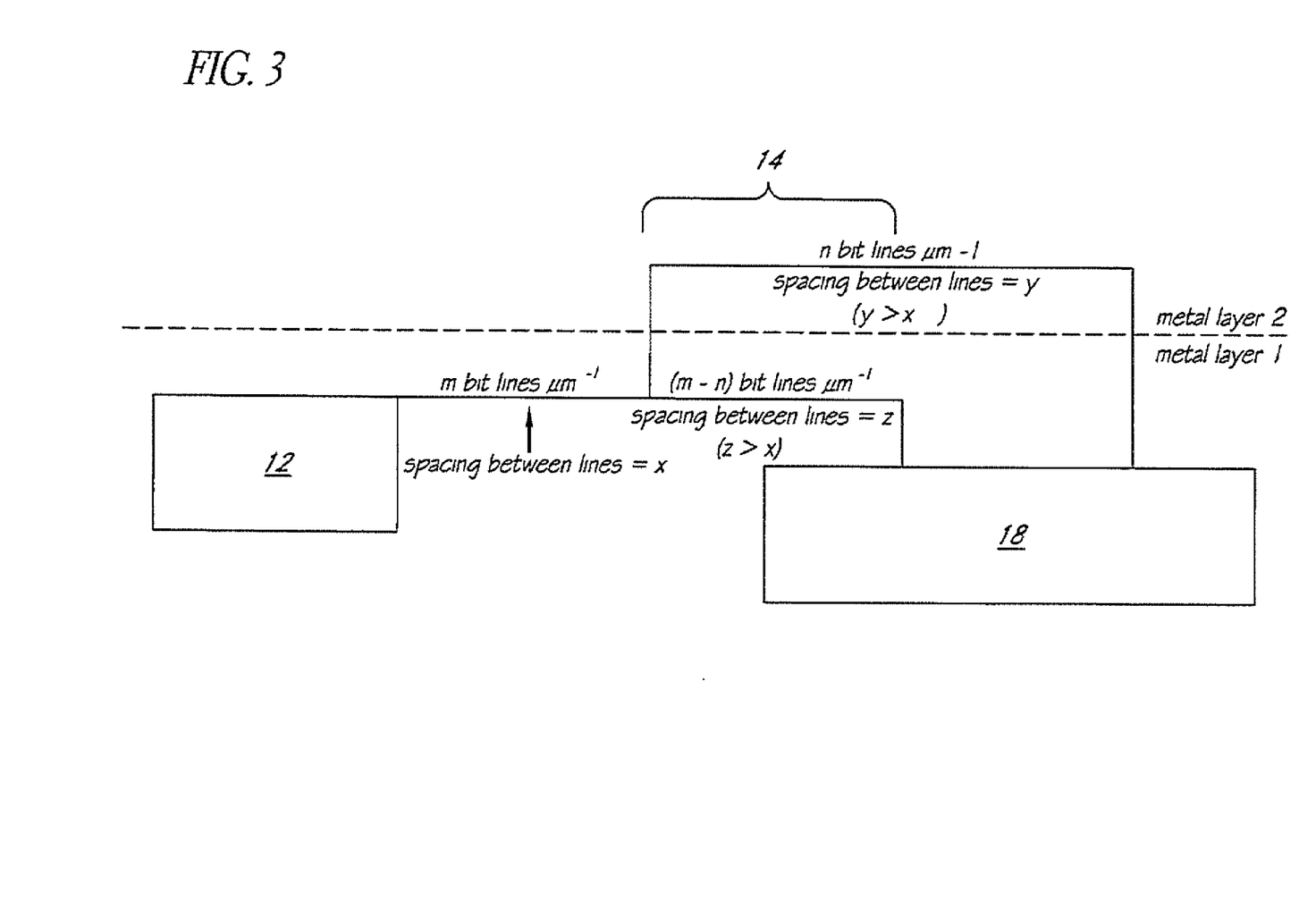
FIG. 3 is a schematic illustration of the layout of FIG. 2, further illustrating the separation of bit lines into first and second metal layers.

A schematic view of this arrangement illustrating the bit lines separated into first and second metal layers is provided in FIG. 3. In particular, FIG. 3 illustrates that n bit lines are elevated to the second metal layer. Elevating a portion of the bit lines to the second metal layer allows the average spacing between bit lines to be increased from x in a first region of the first metal layer to y in the second metal layer, and z in a second region of the first metal layer. The layout schematically illustrated in FIGS. 2 and 3 advantageously allows the sense circuitry 18 to be connected to spaced apart bit lines, rather than the densely packed bit lines that extend from the memory array 12.

The bit line layouts and layout techniques disclosed herein are usable with a wide variety of bit line widths and spacings. For example, in one embodiment, the width of the bit lines 10 extending from the memory array 12 is preferably between about 35 nm and about 200 nm, is more preferably between about 50 nm and about 150 nm, and is most preferably between about 50 nm and about 100 nm. In one embodiment, the spacing between the bit lines 10 extending from the memory array 12 is preferably between about 35 nm and about 250 nm, is more preferably between about 50 nm and about 200 nm, and is most preferably between about 50 nm and about 100 nm. In an exemplary embodiment, the spacing of the bit lines 10 extending from the memory array 12 is approximately equal to the width of the bit lines 10. In a preferred embodiment, the bit lines and spacers are formed using a pitch doubling technique.

As described herein, a portion of the bit lines extending from the memory array 12 are separated into a second metal layer, thereby leaving a reduced number of bit lines remaining in the first metal layer, as illustrated in FIG. 3. The bit lines remaining in the first metal layer are then spread out in the second interface region 16 thereby facilitating contact with sense circuitry 18. In one embodiment, the average spacing between bit lines in the second interface region of the first metal layer is preferably increased to between about 50 nm and about 450 nm, more preferably to between about 75 nm and about 300 nm, and most preferably to between about 100 nm and about 200 nm. In an exemplary embodiment, the average spacing between bit lines in the second interface region of the first metal layer is preferably between one and ten times the width of the bit lines, more preferably between two and eight times the width of the bit lines, and most preferably between two and seven times the width of the bit lines. In certain embodiments, wherein bit lines are arranged into groups separated by a gap, as described in greater detail below, the spacing between bit lines is an average spacing across an array segment that includes at least one group and at least one gap.

In one embodiment, the bit lines in the second metal layer are not pitch doubled. Therefore, in such embodiments electrical signals passing through the bit lines in the second metal layer originate in a pitch doubled array of bit lines extending from the memory array, and are later converted to a non-pitch doubled array of bit lines in the second metal layer. In one embodiment, the spacing between the bit lines in the second metal level is preferably between about 70 nm and about 500 nm, is more preferably between about 100 nm and about 400 nm, and is most preferably between about 100 nm and about 200 nm.

Based on the foregoing, an exemplary integrated circuit layout for conductive lines extending from a memory device includes three arrays of conductive lines. The first array of conductive lines extends from the memory device in a first dimension corresponding to the "length" of the conductive lines. The conductive lines of the first array are also spaced apart from each other in a second width dimension that is orthogonal to the first dimension. The conductive lines of the first array are spaced apart from each other by a spacing "width".

The second array of conductive lines is spaced apart from the first array in a third or vertical dimension that is orthogonal to both the first and second dimensions. That is, the second array is separated from the first array by a "height". The third array of conductive lines is also separated from the second array in the third dimension. Likewise, the conductive lines of the third array generally extend parallel to the conductive lines of the first array in the first dimension. In one embodiment, the number of conductive lines in the first array equals the total number of conductive lines in the second and third arrays combined.

Such embodiments allow electrical signals to be provided from a memory device to sense circuitry on bit lines having varying widths and varying spacings. For example, in one embodiment an electrical signal is passed from the memory array, into an upper metal layer as disclosed herein, and to sense circuitry Using an exemplary layout disclosed herein, the electrical signal passes from pitch doubled bit lines (in the first metal layer) to non-pitch doubled bit lines (in the second metal layer).

In certain embodiments, bit lines in the third array are arranged into groups separated by a gap. In one such embodiment, the average bit line spacing within a group is approximately equal to the bit line spacing x in the first array. The bit line groups are separated by a gap, such that the average bit line spacing in the third array is z, as illustrated in FIG. 3. In one embodiment, the gap is configured to have a width sufficient to accommodate a connection between the second array and the sense circuitry.

Figure 4:
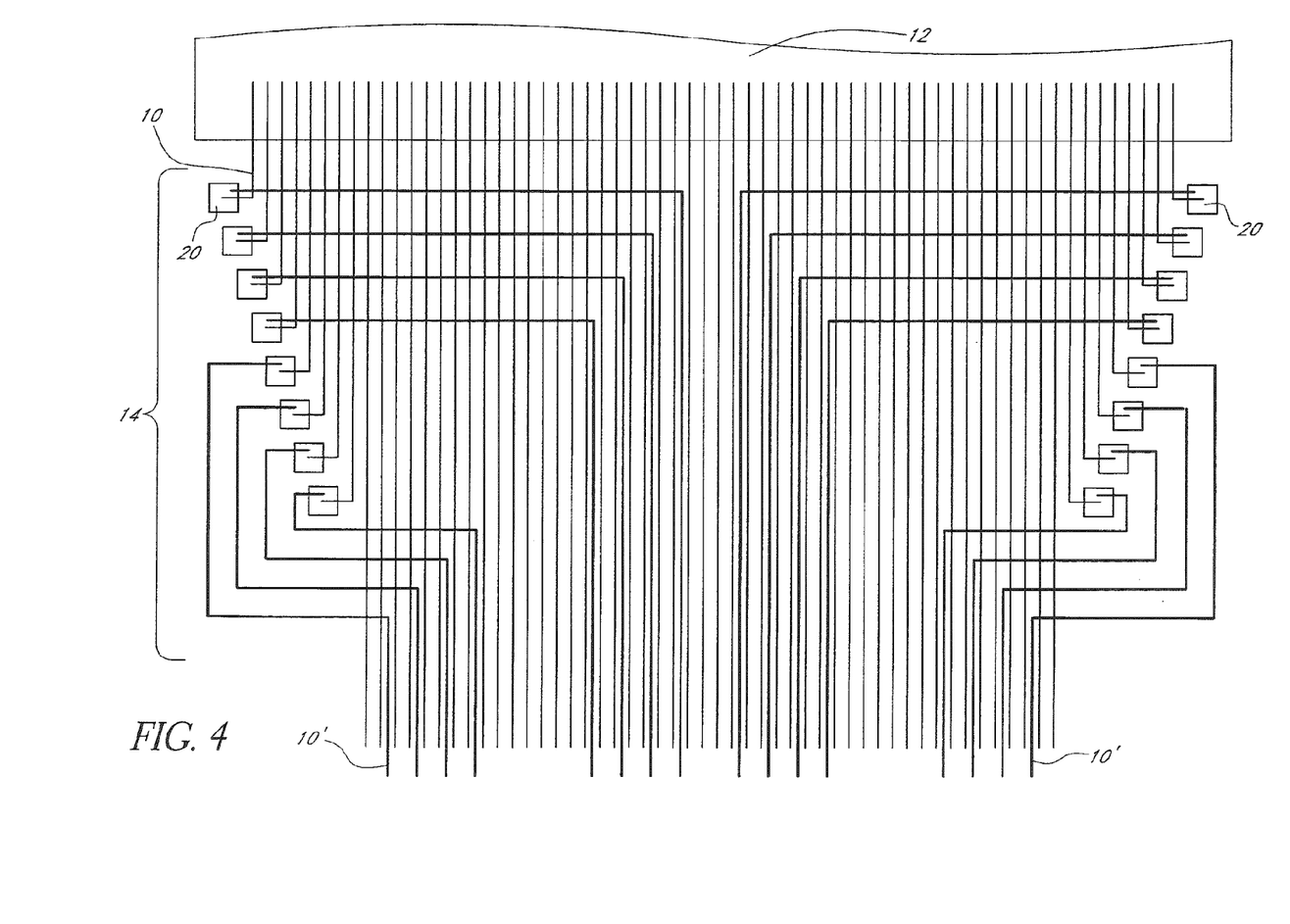
FIG. 4 is a schematic illustration of an exemplary layout for a portion of the first interface region of FIG. 2.

In an exemplary embodiment, the bit lines to be elevated to the second metal layer are connected to landing pads. The landing pads, which are connected to conductive vias that extend upwardly to the second metal layer, have a width greater than the pitch of the bit line array. Therefore, the bit lines at the edge of the bit line array are selected for elevation to the second metal layer. This configuration allows the landing pads to be placed at the edges of the bit line array, as illustrated in FIG. 4. In particular, FIG. 4 illustrates that a selected portion of the plurality of bit lines 10 which are located along the edges of the bit line array have been "turned out" to connect with landing pads 20. The landing pads 20 allow the selected bit lines to be elevated to a second metal layer. In FIG. 4, the bit lines on the second metal layer are indicated by reference numeral 10', and are shown as thicker lines. Optionally, the bit lines in the second metal layer are not formed using a pitch doubling technique, and thus are wider than the bit lines in the first metal layer. The illustrated inwardly stepped configuration advantageously causes only a small amount of space outside the bit line array to be consumed for positioning the landing pads 20.

Figure 6:
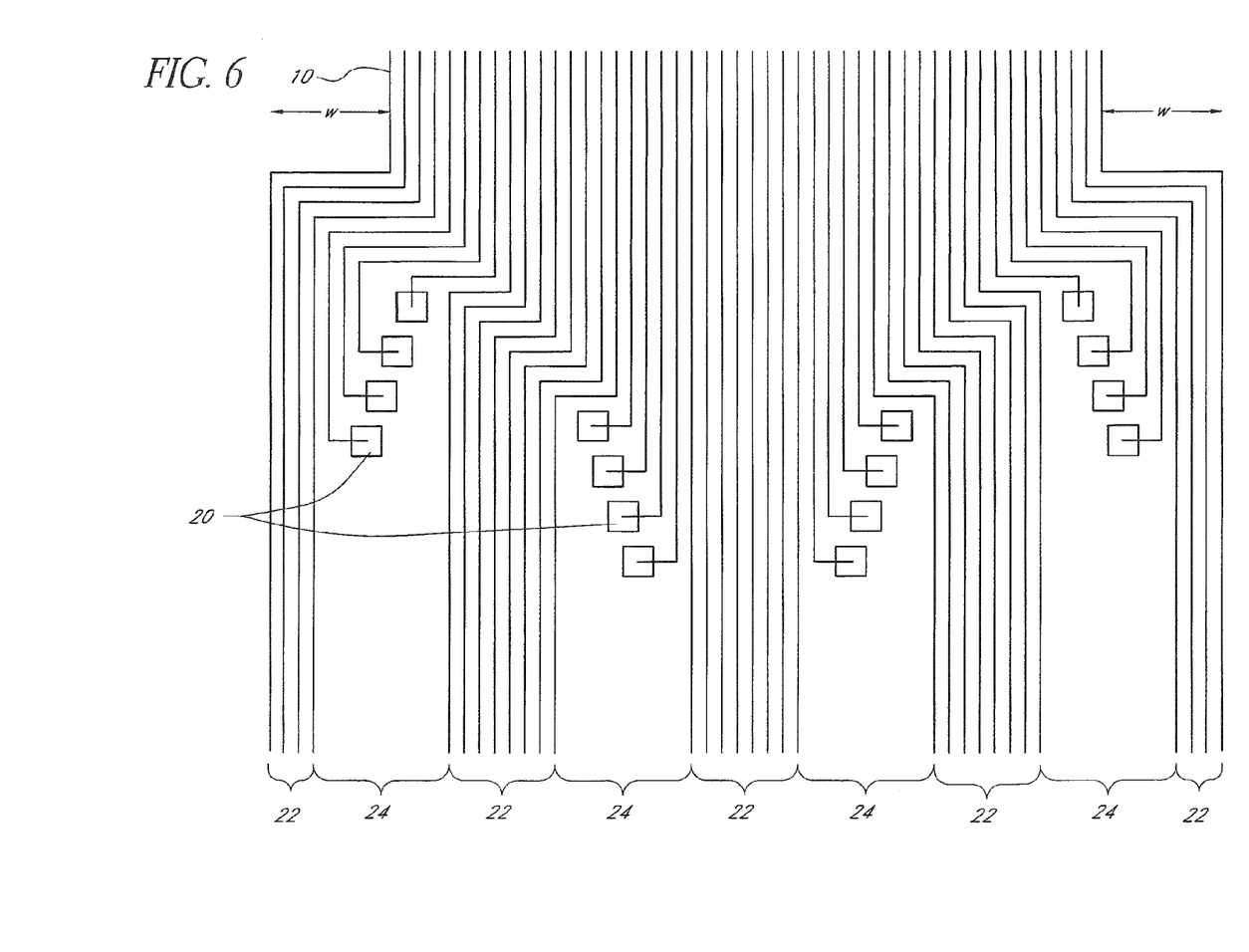
FIG. 6 is a schematic illustration of another exemplary circuit layout for spreading out a plurality of bit lines between a memory array and sense circuitry.

Optionally, bit lines are elevated to the second metal layer in the first interface region 14 in multiple stages. One stage of elevating bit lines is illustrated in FIG. 4. An optional second stage of elevating bit lines is illustrated in FIG. 6, which shows a region between the first stage (FIG. 4) and the sense circuitry. Specifically, FIG. 6 illustrates an exemplary circuit layout for spreading apart bit lines 10 remaining in the first metal layer, and elevating a selected portion of said bit lines to the second metal layer. In this exemplary embodiment, bit lines 10 are spread apart and separated into a plurality of groups 22 separated by a plurality of gaps 24. As illustrated in FIG. 6, the bit lines can be spread out by a width $2w$ without consuming additional space, wherein w is the width of the bit lines removed from each side of the array in the first stage (illustrated in FIG. 4).

Additional landing pads 20, illustrated in FIG. 6, are positioned in the gaps 24; the landing pads 20 are used to elevate a selected portion of the bit lines 10 to the second or upper metal layer. The elevated bit lines in the second metal layer are connected by vertical contacts to the landing pads 20 in the first or lower metal layer. The elevated bit lines of the upper metal layer, indicated by 10' in FIG. 4, are omitted for purposes of clarity in FIG. 6. In a modified embodiment, more than two stages are used to elevate additional bit lines to the second metal layer.

Depending on the number of stages used to elevate bit lines from the first metal layer to the second metal layer, different proportions of bit lines are elevated to the second metal layer in different embodiments. In preferred embodiments, 1 of every k lines extending from the memory array is elevated to the second metal layer, where k is preferably between 2 and 20, more preferably between 3 and 8, and most preferably between 3 and 5.

For purposes of clarity, the exemplary embodiments illustrated in FIGS. 2 and 4 illustrate embodiments wherein only a relatively small number of bit lines 10 extend from the memory array 12. However, while larger numbers of bit lines extend from the memory array in other embodiments, the patterning techniques disclosed herein can be repeated to accommodate the larger number of bit lines. For example, in one embodiment a memory array is divided into 64 segments, with 512 bit lines extending from each segment for a total of 32,768 bit lines extending from the memory array. In such embodiments, each segment is separated by approximately 1600 nm to provide sufficient spacing outside each segment for placement of landing pads 20. In one embodiment, the separation between array segments is provided by leaving a certain number of "dummy" bit lines unconnected. For example, in an embodiment wherein the pitch of the bit lines extending from the memory array is 100 nm, a 1600 nm separation region is provided between array segments by leaving 16 unused bit lines unconnected. Preferably, the separation region has a width between about 1000 nm and about 10000 nm, more preferably the separation region has a width between about 1000 nm and about 2000 nm, and most preferably the separation region has a width between about 1200 nm and about 1800 nm.

Once a portion of the bit lines are elevated to a second metal layer, the remaining bit lines in the lower or first metal level can be spaced out to occupy the area occupied by the elevated bit lines. This advantageously facilitates connection of the bit lines to sense circuitry, such as the multiplexer illustrated in FIG. 1, using conventional techniques. Generally, such conventional techniques would be unable to connect a densely-packed array of pitch doubled bit lines to the sense circuitry. Furthermore, since the portion of the lines on the second layer are more spaced apart, they need not be pitch doubled, as indicated by the thicker lines 10' shown in FIG. 4.

Figure 5:
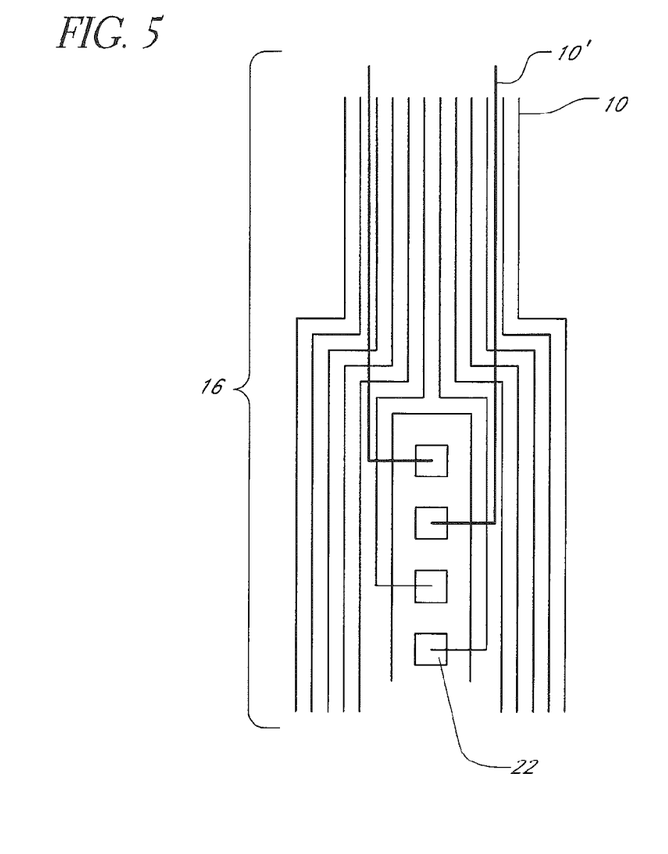
FIG. 5 is a schematic illustration of an exemplary layout for a portion of the second interface region of FIG. 2.

FIG. 5 illustrates a portion of the second interface region 16 wherein the bit lines 10, including the bit lines in the second metal level 10', are connected to multiplexer contacts 22. As illustrated, the bit lines in the lower metal level are "spread out" to accommodate the multiplexer contacts 22 dropping from bit lines in the upper level. The bit lines can be spread out without extending outside the array segment because a portion of the bit lines were removed to the second metal layer in the first interface region 14. In one embodiment, one of the multiplexer contacts is electrically connected to a bit line in the lower metal level, and another of the multiplexer contacts is electrically connected to a bit line in the upper metal level.

The circuit layout techniques disclosed herein can be used with bit line arrays that are pitch doubled, as well as with bit line arrays that are not pitch doubled. Even for bit line arrays which are not pitch doubled, the spacing techniques disclosed herein provide more space for making electrical connections to sense circuitry, and therefore allow such connections to be made more reliably, and with fewer defects. However, in a preferred embodiment, the methods and layouts disclosed herein facilitate connection of pitch doubled bit lines to non-pitch doubled sense circuitry. Advantageously, certain of the embodiments disclosed herein do not require splitting the bit lines from different sides of the memory array, and do not require significantly spreading the bit lines outside the original array dimensions.

The bit lines arrays disclosed herein can be formed using conventional materials, such as tungsten, copper, and aluminum. In one embodiment, the bit lines are formed suing a damascene process.

While the foregoing detailed description discloses several embodiments of the present invention, it should be understood that this disclosure is illustrative only and is not limiting of the present invention. It should be appreciated that the specific configurations and operations disclosed can differ from those described above, and that the methods described herein can be used in contexts other than integrated circuit layout.

The invention claimed is:

1. An integrated circuit, comprising:
a plurality of conductive interconnects extending out of an array region on a first level,
wherein, outside of the array region, some of the conductive interconnects extend to a second level that is vertically separated from the first level,
wherein the some of the conductive interconnects extend across an area of the integrated circuit on the second level,
wherein the some of the conductive interconnects extend back to the first level at an end of the area, and
wherein other of the conductive interconnects remain on the first level; and
sense circuitry comprising a multiplexer and a sense amplifier connected to an output of the multiplexer, wherein the some and the other of the conductive interconnects electrically connect to the sense circuitry, wherein the sense circuitry is disposed on the first level.

2. The integrated circuit of claim 1, wherein the sense circuitry is disposed on only one side of the array region.

3. The integrated circuit of claim 1, wherein portions of the conductive interconnects on the second level have a width greater than portions of the conductive interconnects on the first level.

4. The integrated circuit of claim 1, wherein:
a first group of the some of the conductive interconnects extends to the second level in a first transition region; and
a second group of the some of the conductive interconnects extends the second level in a second transition region, the second transition region disposed farther from the array region than the first transition region.

5. The integrated circuit of claim 1, wherein the array region comprises a memory array comprising a plurality of memory cells.

6. The integrated circuit of claim 5, wherein the conductive interconnects are bit lines.

7. The integrated circuit of claim 1, wherein, within the array region, the plurality of conductive interconnects has a smaller pitch than a pitch of the some of the conductive interconnects.

8. The integrated circuit of claim 7, wherein, within the array region, the plurality of conductive interconnects has a smaller pitch than a pitch of the other of the conductive interconnects.

9. The integrated circuit of claim 7, wherein, within the array region, the pitch of the plurality of conductive interconnects is about 100 nm or less.

* * * * *

UNITED STATES PATENT AND TRADEMARK OFFICE
CERTIFICATE OF CORRECTION

Page 1 of 2

PATENT NO. : 8,264,010 B2
APPLICATION NO. : 12/830754
DATED : September 11, 2012
INVENTOR(S) : Tang et al.

It is certified that error appears in the above-identified patent and that said Letters Patent is hereby corrected as shown below:

On the title page of the patent item [74] in the Attorney, Agent or Firm section, "Lerner, David, Littenberg &" should read --Lerner, David, Littenberg,--.

In the Specification
Column 1, line 65, "the "pitch" of" should read --as the "as the "pitch" of--.
Column 2, line 27, "conductive lines are" should read --conductive lines is--.
Column 2, line 29, "conductive lines are" should read --conductive lines is--.
Column 3, line 30, "contacts are electrically" should read --contacts is electrically--.
Column 3, line 32, "contacts are electrically" should read --contacts is electrically--.
Column 3, line 38, "bit lines are" should read --bit lines is--.
Column 3, line 42, "bit lines are" should read --bit lines is--.
Column 3, line 49, "contacts are" should read --contacts is--.
Column 3, line 51, "contacts are" should read --contacts is--.
Column 4, line 65, "pitch doubling" should read --pitch-doubling--.
Column 5, lines 3-4, "pitch doubled" should read --pitch-doubled--.
Column 5, line 40, "lines are provided" should read --lines is provided--.
Column 5, line 63, "lines are elevated" should read --lines is elevated--.
Column 6, line 25, "lines are elevated" should read --lines is elevated--.
Column 6, line 58, "pitch doubling" should read --pitch-doubling--.
Column 7, line 17, "pitch doubled" should read --pitch-doubled--.
Column 7, lines 18-19, "non-pitch doubled" should read --non-pitch-doubled--.
Column 7, line 51, "sense circuitry" should read --sense circuitry.--.
Column 7, line 52, "pitch doubled" should read --pitch-doubled--.
Column 7, line 53, "pitch doubled" should read --pitch-doubled--.
Column 8, line 13, "pitch doubling" should read --pitch-doubling--.
Column 9, line 8, "lines are elevated" should read --lines is elevated- --.
Column 9, line 15, "pitch doubled" should read --pitch-doubled--.
Column 9, line 17, "are more spaced" should read --is more spaced--.
Column 9, line 26, "lines were removed" should read --lines was removed--.

Signed and Sealed this
Eighth Day of July, 2014

Michelle K. Lee
*Deputy Director of the United States Patent and Trademark Office*

CERTIFICATE OF CORRECTION (continued)
U.S. Pat. No. 8,264,010 B2

Column 9, line 39, "pitch doubled" should read --pitch-doubled--.
Column 9, line 47, "formed suing a" should read --formed using a--.

In the Claims
Claim 4, Column 10, line 34, "extends the second" should read --extends to the second--.